United States Patent [19]
Ward

[11] 3,962,490
[45] June 8, 1976

[54] PREPARATION OF NICKEL AND CHROMIUM SUBSTRATES FOR CERAMIC COATING

[75] Inventor: Rodney L. Ward, Streetsboro, Ohio

[73] Assignee: Ferro Corporation, Cleveland, Ohio

[22] Filed: Jan. 24, 1974

[21] Appl. No.: 436,180

[52] U.S. Cl. ............................... 427/193; 29/194; 29/195; 427/226; 427/229; 427/376; 427/419
[51] Int. Cl.² ........................ C23C 3/04; C23D 5/00
[58] Field of Search ............. 117/70 C, 129, 130 R, 117/23, 71 M; 427/226, 229, 376, 419, 193; 428/432

[56] References Cited
UNITED STATES PATENTS

| | | | |
|---|---|---|---|
| 2,716,271 | 8/1955 | Higgins | 117/129 X |
| 2,763,569 | 9/1956 | Bradstreet et al. | 427/226 X |
| 2,768,907 | 10/1956 | Lusby | 427/226 |
| 2,940,865 | 6/1960 | Sullivan | 117/70 C X |
| 2,977,241 | 3/1961 | Oliver et al. | 117/129 X |
| 3,041,201 | 6/1962 | Roelofs | 117/129 X |
| 3,251,712 | 5/1966 | Berger | 117/130 R X |
| 3,575,838 | 4/1971 | Hughes | 204/181 |
| 3,827,903 | 8/1974 | Hudson et al. | 117/130 R X |
| 3,911,177 | 10/1975 | Humbert et al. | 427/376 X |

*Primary Examiner*—Ralph Husack
*Attorney, Agent, or Firm*—Milton L. Simmons; Wesley B. Taylor

[57] ABSTRACT

A process and product are disclosed relating to the preparation of a metallic substrate of a workpiece for a subsequent deposition of a ceramic coating, such as porcelain enamel, in which the metal of the substrate is one that is not sufficiently electrochemically active to be coated by electrophoresis, for example, stainless steel or those alloys containing principally nickel and/or chromium. In one form, the metallic substrate is first covered with an oxide, and preferably a thermally decomposable compound, of a transition metal selected from Groups IIIB through Group IIB of the Periodic Table of The Elements. The workpiece is then heated to alloy the transition metal with the substrate of the workpiece, after which a ceramic coat may be applied. When the transition metal is present as a thermally decomposable compound, the compound must decompose prior to reaching an alloying temperature.

17 Claims, 4 Drawing Figures

PREPARATION OF NICKEL AND CHROMIUM SUBSTRATES FOR CERAMIC COATING

BACKGROUND OF THE INVENTION

The ceramic coating of metals, such as porcelain enameling, is well known in the art. A preferred process for depositing a ceramic coat is by electrophoresis as described, for example, in U.S. Pat. No. 3,575,838 to Hughes. Ceramic coating by electrophoresis is generally regarded as superior to conventional dipping or spraying techniques, because electrophoresis is more rapid and more effectively coats all surfaces of a workpiece, including its edges.

However, not all metals can be coated by electrophoresis because not all metals are sufficiently electrochemically active. By the term "electrochemically active" is meant the ability to pass metal ions into an electro-conducting solution during current flow. Examples of metals which are sufficiently electrochemically active when immersed in an electrophoretic medium and, therefore, can be coated by electrophoresis are mild steel and sandblasted cast iron. On the other hand, notable among metals which are not sufficiently electrochemically active and which, therefore, cannot be readily coated by electrophoresis are alloys containing nickel or chromium or alloys of nickel or chromium in appreciable amounts, for example, at least 10% by weight of such a metal or alloys of such metals. These two elements appear to be largely responsible for the failure of a metal containing either one of them to be suitably coated by electrophoresis. The various stainless steels are examples of such alloys as well as the so-called super alloys, such as those sold under the trademarks, Inconel, Monel, Incoloy, and Hastelloy.

It is possible to deposit ceramic coats on alloys like stainless steels other than by electrophoresis. For example, stainless steel parts have been treated with an aqueous slurry of ceramic particles and then fired. Such stainless steel parts include those of intricate electric circuit systems, jet engine parts, furnace tooling, automotive exhaust trains, and the like. Ceramic coats are usually applied to stainless steel and other super alloys to protect them from corrosion and oxidation at elevated temperatures and/or corrosive atmospheres.

However, prior techniques for ceramic coating of stainless steel and other like alloys other than by electrophoresis are also fraught with problems. For instance, the various methods of preparing stainless steels for ceramic coating such as etching, sandblasting, etc., have not been entirely satisfactory. Although sandblasting is the best method at present and is the only known technique to be commercially successful in making a stainless steel surface suitable for ceramic coating, many times even this process falls far short of being completely successful. Sandblasting is expensive and also a limited operation, because many formed parts have areas that are not accessible to the flow of abrasive material. Even when a part is successfully sandblasted, the quality of a subsequently applied ceramic coating can not be guaranteed. Because of the problems met, especially spalling, ceramic coating of stainless steels has often been considered a last resort.

In addition, even if stainless steel parts become ceramically coated, they previously have not been free of problems later encountered in use, especially when such parts are subjected to elevated temperatures. Ceramic coatings by nature of their composition inherently have a low thermal expansion. Stainless steel alloys in general have a thermal expansion much higher than mild steels. As a result, there is a far greater expansion differential between a stainless steel-ceramic coat system than a mild steelceramic coat system. This difference in thermal expansion limits the actual thickness of most ceramic coats to approximately one mil. Heavier or thicker applications only result in spalling, while a thinner application of a ceramic coat does not provide the desired protection. When the thickness of the ceramic coat becomes critical, application of a ceramic slip as by dipping is usually not feasible and spray applications are necessary. Sharp edges and small radii are also critical application points, since these areas amplify the expansion problems due to differences in thermal expansion rates.

SUMMARY OF THE INVENTION

The present invention provides an improved process and product relating to the preparation of nickel and/or chromium substrates, and especially alloys like stainless steel, for subsequent application of a ceramic coat. The process is relatively simple, completely avoiding preliminary steps like sandblasting and results in a strongly adherent, uniform ceramic coating. The effect of the differences in thermal expansion between the ceramic coat and the metallic base is appreciably diminished. In fact, a thicker ceramic coat can be deposited by virtue of the present invention than formerly thought possible because of thermal expansion problems previously met.

In practice, in one form, a nickel and/or chromium substrate of a metallic workpiece is covered with an oxide, and preferably from solution with a thermally decomposable compound, of a transition metal selected from Groups IIIB through Group IIB of the Periodic Table of the Elements. The workpiece is then heated to an alloying temperature to alloy the transition metal with the substrate. It is important that the thermally decomposable compound of the transitional metal, when used, be decomposable below, and preferably substantially below, the alloying temperature of the workpiece and transition metal. After the alloying step, a ceramic frit, for example, is applied and the workpiece fired to produce a ceramic coat.

BRIEF DESCRIPTION OF THE DRAWING

The accompanying drawing comprises reproductions of photomicrographs of stainless steel workpieces having ceramic coats of which some were prepared in accordance with the present invention.

DESCRIPTION OF THE PREFERRED EMBODIMENTS

Figure 1:
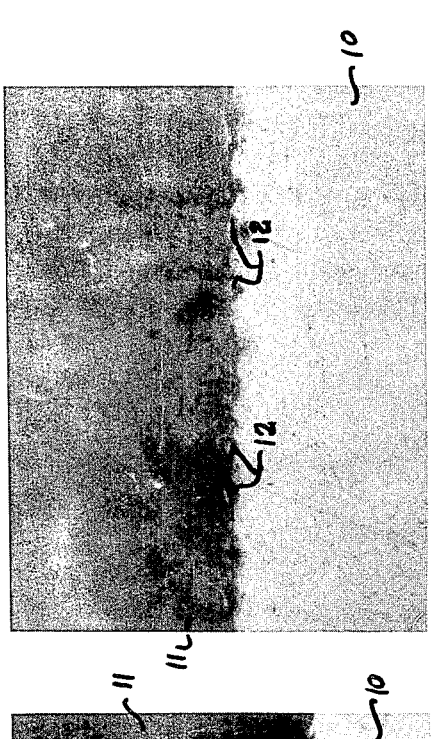
FIG. 1 is a photomicrograph at 250X of stainless steel having an attempted ceramic coat but lacking treatment with an interfacial transitional metal as contemplated by the present invention.
Figure 2:
FIG. 2 is a photomicrograph at 250X of stainless steel having a ceramic coat in which, prior to deposition of the coat, the stainless steel was treated with a two percent by weight aqueous solution of ammonium molybdate in accordance with the present invention.

In one embodiment, the process of the present invention may include these steps:

1. Cleaning the substrate of the workpiece to be coated.
2. Applying a film of an oxide, or a thermally decomposable compound, of a transition metal,
3. Heating the workpiece to alloy the transition metal with the substrate, while decomposing the compound, if present, in advance of reaching an alloying temperature, and
4. Applying ceramic particles on the treated substrate and firing to deposit a ceramic coat.

Referring to these steps sequentially and in greater detail, the cleaning step is designed merely to remove surface contaminants which would interfere with the adherence of any type of subsequently deposited material, for example, the removal of grease, oil, and other foreign materials from the substrate. If the substrate is already substantially clean, this step can be eliminated. In one successful cleaning step, a workpiece was placed in a conventional alkaline cleaner, for example one sold under the trademark Oakite, for 15 to 20 minutes followed by a hot water rinse.

The metallic substrate of the workpiece to be treated in accordance with the present invention can be characterized as one that is not sufficiently electrochemically active to be coated by electrophoresis. Such metals are illustrated by alloys like stainless steel and those alloys sold under such trademarks as Inconel, Monel, Incoloy, and Hastelloy. Common to all of such alloys in the presence of nickel or chromium or both of these elements in a significant amount, and it is these elements which are largely responsible for the difficulty to coat such alloys with ceramic materials by electrophoresis. This amount may be as small as 10 percent by weight (nickel or chromium alone or in combination), although the amount is usually much greater.

The following illustrates the type of metallic substrates contemplated by the present invention. All stainless steel may be used in the present process, including those of the 200, 300, and 400 series. As an example, stainless steel 201 is reported to have this composition by weight percent:

| Ingredient | Percent |
| --- | --- |
| Carbon | 0.15 Maximum |
| Manganese | 5.5 to 7.5 |
| Silicon | 1.0 Maximum |
| Phosphorous | 0.06 Maximum |
| Sulphur | 0.03 Maximum |
| Chromium | 16.00 to 18.00 |
| Nickel | 3.50 to 5.50 |
| Nitrogen | 0.25 |
| Iron | Balance |

The amount of cumulative nickel and chromium in stainless steel 201 may, therefore, range from about 19.5% to about 23.5%. Stainless steel 302 contains about 15 percent to about 29 percent by weight of chromium and nickel combined. Other stainless steels contain still greater amounts of nickel and chromium. For example, stainless steel 310 contains from about 24% to about 26% chromium and from about 19% to about 22% nickel.

Stainless steel 410 is an example of an alloy containing chromium but no nickel. Its composition has been given in weight percent as:

| Ingredient | Percent |
| --- | --- |
| Carbon | 0.15 Maximum |
| Manganese | 1.00 Maximum |
| Silicon | 1.00 Maximum |
| Phosphorous | 0.04 Maximum |
| Sulphur | 0.03 Maximum |
| Chromium | 11.5 to 13.5 |
| Iron | Balance |

On the other hand, Monel alloys of the 400 and 500 series contain nickel but no chromium. For example, Monel alloy 400 has this composition in weight percent:

| Ingredient | Percent |
| --- | --- |
| Nickel | 65.0 |
| Carbon | 0.12 |
| Manganese | 0.90 |
| Iron | 1.35 |
| Sulphur | 0.005 |
| Silicon | 0.15 |
| Copper | 31.5 |

Monel alloy K-500 has this composition in weight percent:

| Ingredient | Percent |
| --- | --- |
| Nickel | 65.0 |
| Carbon | 0.15 |
| Manganese | 0.60 |
| Iron | 1.0 |
| Silicon | 0.15 |
| Sulphur | 0.005 |
| Copper | 29.5 |
| Aluminum | 2.8 |
| Titanium | 0.5 |

Inconel alloy 600 has this composition in weight percent:

| Ingredient | Percent |
| --- | --- |
| Nickel | 76.0 |
| Carbon | 0.04 |
| Manganese | 0.20 |
| Iron | 7.2 |
| Sulphur | 0.007 |
| Silicon | 0.20 |
| Copper | 0.10 |
| Chromium | 15.8 |

As further illustrations, Inconel alloy 625 contains 61% nickel and 22% chromium; Inconel alloy 718 contains 52.2% nickel and 18.6% chromium; and Incoloy alloy 800 contains 32% nickel and 20.5% chromium.

By the term "transition metal" is meant a metal selected from Groups IIIB through Group IIB of the Periodic Table of the Elements including the rare earths. Here and in the claims, "Group IIIB through Group IIB" is taken to include Groups IIIB, IVB, VB, VIB, VIIB, VIIIB, IB, and IIB. Specific examples of transition metals that can be used include molybdenum, chromium, cobalt, copper, manganese, vanadium, iron, nickel, zinc, and tungsten. Molybdenum is preferred.

The transition metal is not used as the free metal but is present as the oxide or as part of a thermally decomposable compound. While the oxides of the transition metals are operational, their use is not as satisfactory as the decomposable compounds. Because of their limited solubility in liquid carriers like water, only a relatively small quantity of the oxides can be deposited in this manner, and dispersions of the oxides are not as easily handled. Accordingly, it is preferred to use the thermally decomposable compounds and especially those that are soluble in a liquid carrier in order to facilitate the metal's deposition onto a substrate of the workpiece and to render the metal available for alloying with the workpiece as hereinafter described. By "thermally decomposable" is meant that the compound under the influence of heat releases the transition metal in a form suitable for the alloying step, for example, the oxide form.

The thermally decomposable compound of the transition metal must decompose at a temperature below the temperature at which the workpiece is alloyed. Compounds that melt or boil during the alloying step do not produce the desired condition, because the compound as a whole tends to vaporize and leave little of no metal, such as the oxide, on the substrate. Also, blistering may result in the after-applied ceramic coat when the transition metal compound is not suitably decomposed. Likewise, spalling occurs and the ceramic coat has no impact adherence. Any compound of d transition metal can be used in which the non-metallic moiety is fugitive below the alloying temperature of the workpiece. Those decomposable compounds that decompose below but near the alloying temperature are not as preferred as those which decompose at least 300°F below the alloying temperature. Preferably, the decomposable compound decomposes at a temperature below about 600°F.

As indicated, the metal oxide or the thermally decomposable compound is conveyed to the substrate by a liquid carrier, in which the oxide or compound is dispersed or preferably dissolved, after which the carrier is removed to deposit a coat or film of the oxide or compound on the substrate. The liquid carrier may be removed by evaporation, such as by leaving the substrate at room temperature or heating it slightly. Or one may go directly to the alloying step as hereinafter described. The purpose of the liquid carrier step is to obtain a relatively thin but substantially continuous film of the transition metal oxide or compound on the surface of the substrate.

Since the liquid carrier merely conveys the transition metal to the surface of the workpiece, it can comprise any non-reactive liquid including organic solvents like benzene, toluene, alcohol, and the like. However, water is much preferred since it is inexpensive and non-toxic. Use of water also enables ionizable compounds of the transition metals to be readily employed. Accordingly, the preferred transition metal compounds are watersoluble compounds which decompose, as described, below the alloying temperature to be used. Since the pH of the aqueous medium is not critical and, indeed, can vary from a pH of about 2 to a pH of about 9, a greater number of compounds can be used. Examples include the metal acid salts of the metals indicated, such as the sulphates, chlorides, carbonates, nitrates, phosphates, carboxylates, as well as the hydroxides of the metals indicated where the desired requisite of thermal decomposition is met. Still other compounds are useful, such as the metal acids like chromic acid, oxides like $MoO_3$, $WO_3$, and more complex compounds like ammonium molybdate, sodium molybdate, molybdosilicic acid, molybdophosphoric acid, ammonium metavanadate, and corresponding compounds of the other metals, etc.

The dispersion or solution of the transition metal compound is applied to the workpiece in any convenient manner such as by brushing or spraying, but dipping the workpiece into the dispersion or solution is preferred since a more uniform coat is apt to be obtained. The times and conditions for applying the transition metal compounds are not critical. For example, the workpiece may be contacted for 15 seconds to 30 minutes with a dispersion or solution of the transition metal compound containing from about 0.5% to about 10% by weight of the compound. The solution or dispersion may be at room temperatures, but heating the liquid carrier may be desirable to facilitate solution of the compound, for example, from about 125°F to about 200°F. Preferred conditions are obtained when the solution is heated from about 140°F to about 160°F with submersion times for the workpiece of about 2 to about 4 minutes. These parameters allow the substrate to become heated, so that when removed from the liquid medium, the workpiece dries readily and produces a continuous, uniform film. Relatively small amounts of known wetting agents may be added to the bath to insure film uniformity. The workpiece is then placed in a drier, if necessary, to remove excess water and complete the film formation. The use of a drier can be eliminated if time is not a factor. No apparent chemical reaction takes place between the film of the transition metal oxide or compound and the substrate, and the film is not chemically bonded to the metallic substrate at this phase of the process. The amount of transition metal compound deposited is determined largely by the concentration of the compound in the liquid carrier.

The workpiece is next heated to an alloying temperature. In effect, this operation embodies two steps in which the decomposable compound, where used, first decomposes at a temperature below the alloying temperature, and then at a higher temperature the actually alloying takes place. If desired, the two steps can be carried out at different times.

However, because the decomposition step is often transient, it is preferred to carry out both steps with one heat. For example, the workpiece having a film of the decomposable compound at room temperature can be directly placed within a furnace at an alloying temperature. As the workpiece heats, the compound decomposes as required before the workpiece itself reaches the alloying temperature. As indicated, the compound desirably decomposes about at least 300°F below the alloying temperature employed and preferably below about 600°F. The effect of the decomposing step is to leave the transition metal in a converted form, usually the oxide, in contact with the substrate.

The purpose of the alloying step is to alloy the transition metal with the substrate of the workpiece. Alloying may be carried out for about 1 to 30 minutes at a temperature between about 1000°F and about 1800°F. The resulting surface is normally characterized by a black, uniform continuous coating with a texture comparable to a mild etch. The surface formed is very adherent and cannot be removed by normal abrasion.

The form in which the transition metal is alloyed with the substrate cannot be clearly determined. It is probable that the oxide of the metal is formed, either during the decomposition step (if the oxide is not used initially) or during the early stages of alloying. But it is not necessarily the metal oxide which alloys with the substrate in all cases. Some evidence indicates that the transition metal is present as the metal in solid solution with other metal compounds of the substrate or that the transition metal forms other metal alloys. Microscopic examination of the surface indicates a degree of roughness comparable to a mild sandblast. In the case of molybdenum, for instance, small crystals, possibly of $MoNi_3$, $MoNi_4$, or molybdenum metal, have been dispersed throughout the coating. Photomicrographs have shown that the molybdenum diffuses into the metallic substrate at the interface and encompasses particles of the stainless steel substrate.

It is emphasized that the product at this stage represents in itself an article of commerce. When the transitional metal becomes alloyed with the workpiece at their interface, the metal protects the workpiece from oxidation and corrosion.

After the transition metal has been alloyed with the substrate, a ceramic coat is applied. The invention does not reside in the use of any particular ceramic particles or frit. The particles are applied as from an aqueous slurry or slip and the workpiece fired to produce a ceramic coat by known techniques and means. There is little or no spalling or chipping of the present ceramic coat.

In a modified form of the process, the alloying step can be delayed until after the ceramic particles are applied, as long as the temperature reached during the firing of the ceramic particles to produce a ceramic coat is sufficiently high to alloy the workpiece and transitional metal. In brief, in this form of the invention, the workpiece is heated below an alloying temperature to decompose the thermally decomposable compound, after which the ceramic particles are deposited onto the treated workpiece and the workpiece is fired to produce the ceramic coat from the particles. In the modified form of the process, either the heating or firing step also includes heating to a temperature sufficient to alloy the transitional metal with the substrate of the workpiece.

The following examples are intended only to illustrate the invention and should not be taken to impose limitations on the claims. Parts and percentages are by weight unless otherwise indicated.

EXAMPLE 1 through 8

Several samples of 304 stainless steel strip, measuring 3 inches by 3 inches were cleaned in an alkaline cleaner, rinsed and dried. Stainless steel 304 is generally considered the most difficult alloy to coat ceramically, because it has the highest thermal expansion of all the commercial stainless steels. One of the sample squares was heated to 1600°F for 10 minutes and then sandblasted. This sample was used as a standard.

Eight different aqueous solutions of ammonium molybdate were prepared differing only in concentrations, namely, containing 0.25, 0.5, 1, 2, 3, 4, 5, and 6 weight percent, respectively of the ammonium molybdate. The solutions varied from a pH of 4.4 to 5.4 depending upon the concentration. While each solution was maintained at a constant temperature of about 160°F, four samples of the 304 stainless steel were placed in each solution for 2 minutes and then removed and dried at approximately 200°F. The four samples from each solution were then heated at 1500°F, 1600°F, 1700°F, and 1800°F respectively for 10 minutes. Very early in this step and well before the alloying temperature was reached, the ammonium molybdate decomposed.

A ceramic aqueous slip of the following composition was conventionally applied over the alloyed surfaces of each sample at an application of 32 grams of slip per square foot. The ceramic slip had this composition:

| Frit Composition | Weight % | Mill Addition | Parts by Weight |
|---|---|---|---|
| $Al_2O_3$ | 0.98 | Frit | 100 |
| BaO | 43.99 | Clay | 6 |
| $B_2O_3$ | 9.86 | Boric Acid | ¼ |
| ZnO | 5.95 | Bentonite | ¼ |
| $SiO_2$ | 37.72 | Potassium Nitrite | ⅜ |
| $ZrO_2$ | 1.49 | Chrome Oxide | 30 |
| Total | 99.99 | Water | 55 |
| | | Fineness: trace/325M/50cc | |

The data for fineness can be read as a trace of the slip being left on a 325 mesh screen, U.S. Standard sieve, from a 50cc sample. All samples were dried at approximately 200°F and then fired for 10 minutes at 1800°F to produce a ceramic coat. Upon cooling, the sandblasted standard sample showed edge spalling, while the rest of the test samples remained covered. All samples were impact tested for adherence of the ceramic coat. The adherence for the standard sample was only fair, while all of the remaining test samples showed good to excellent adherence.

All samples were next placed in a furnace having an ambient atmosphere for 1,000 hours at 1700°F and observed every 100 hours. At the end of this test, the sandblasted sample had severe oxidation and corrosion around the edges and in the impacted spot. The remaining test samples showed only slight corrosion in the impact spot and no edge deterioration at all. It was apparent upon observing the impact area of the test samples that the molybdenum coating itself had protected the substrate and had also allowed the ceramic coat to heal over the impact during the furnace operation.

EXAMPLES 9 through 14

Additional test samples of 304 stainless steel were prepared as described for Examples 1 through 8. Standard samples were also similarly prepared. The cleaned test samples were dipped in aqueous solution of two percent by weight ammonium molybdate for two minutes at 150°F and dried. All samples were heated at 1600°F for 10 minutes to effect the alloying. Both standard and test samples then received applications of varying amounts of an aqueous ceramic slip, namely, at 24, 32, 40, 48, 56 and 64 grams per square foot wet. Two ceramic slips were used for each test sample. One ceramic slip was the same as that for Examples 1 through 8, and the second ceramic slip had this composition:

| Frit Composition | Weight % | Mill Addition | Parts by Weight |
|---|---|---|---|
| BaO | 16.03 | Frit | 100 |
| $B_2O_3$ | 7.42 | Clay | 6 |
| CaO | 1.47 | Boric Acid | ¼ |
| $K_2O$ | 1.28 | Bentonite | ¼ |
| $Li_2O$ | 0.76 | Potassium Nitrite | ⅜ |
| MgO | 0.28 | Chrome Oxide | 2 |
| $Na_2O$ | 2.46 | Water | 45 |
| $SiO_2$ | 44.12 | Fineness: Trace/325M/50cc | |
| $TiO_2$ | 8.57 | | |
| ZnO | 11.91 | | |
| $ZrO_2$ | 2.76 | | |

| Frit Composition Weight % | | Mill Addition Parts by Weight |
|---|---|---|
| SrO | 0.84 | |
| CeO$_2$ | 2.11 | |
| Total | 100.00 | |

All samples were fired at 1800°F for 10 minutes and observed upon cooling. The standard having applications of 40, 48, 56, and 64 grams per square foot of ceramic slip spalled severely with both ceramic systems. Standard samples with applications of 24 and 32 grams per square foot wet had smaller amounts of edge spallings with each enamel system but were still unacceptable. The test samples showed some spalling within the ceramic coat on applications of 48, 56 and 64 grams per square foot wet. This type of spall, however, is not serious because it occurs within the ceramic coating itself and the substrate is still protected. Moreover, the ceramic coat fuses over upon refiring and this was observed.

The more usual applications of 24, 32 and 40 grams per square foot of ceramic slip had no spalling whatever on the test samples. When all of the samples of this series were heat tested as in Examples 1 through 8, the results were the same. Applications of 48 to 64 grams per square foot produced fired thicknesses of about 5 to 8 mils. This application is heavier than that which would be normally applied.

EXAMPLES 15 through 23

A series of tests was run on two samples of each of these alloys: stainless steel 304, 310, 300, 347, 316, 409, and 430, Inconel 600, and Hastelloy X. All samples were cleaned in alkaline cleaner such as Oakite, rinsed, and dipped in an aqueous two percent by weight ammonium molybdate bath at 150°F for 3 minutes and then dried. The samples were heated for 10 minutes at 1800°F. Long before reaching this alloying temperature, the ammonium molybdate decomposed.

The ceramic slip of Examples 1 through 8 was applied at 32 grams per square foot wet and the samples fired at 1800°F for 10 minutes. After firing, no spalling was observed on any of these samples and impact adherence was good to excellent on all samples.

EXAMPLES 24 through 27

Four samples of 304 stainless steel strip were cleaned by an alkaline cleaner and rinsed with water. Three aqueous solutions were next prepared containing five percent by weight of chromic acid, ammonium metavanadate and ammonium molybdate, respectively. An aqueous dispersion was also prepared containing about 0.5 percent by weight of tungstic oxide.

All aqueous media were heated to 160°F and the samples immersed for two minutes. After heating at temperatures below 600°F to thermally decompose the metal compounds of the test samples (except the oxide), all samples were heated at 1800°F for 10 minutes to alloy the test samples with the transition metals. This produced a black velvet type of surface on each sample. The ceramic slip of Examples 1 through 8 was next applied to each test sample which was then fired for 10 minutes at 1800°F. No spalling occurred and all samples had excellent impact adherence.

EXAMPLES 28 through 31

These examples illustrate a modified form of the process. Additional samples of 304 stainless steel were prepared as described in Examples 24 through 27. In these examples, one sample was submerged in an aqueous solution each of ferric sulfate, cobalt sulfate, nickel sulfate, and zinc chloride. Each of the solutions contained five percent by weight of the indicated salt and was maintained at 150°F. After submersion in the solution for about three minutes, all samples were heated to decompose the salts, and then covered with a ceramic slip, and fired in one operation for 10 minutes at 1800°F. All samples had good to excellent adherence and no spalling occurred.

It will be noted that in these examples there was no alloying prior to application of the ceramic slip. The described heating operation performed both the alloying of the metals and the firing of the slip to produce a ceramic coat.

EXAMPLES 32 through 36

These examples illustrate the importance of decomposing the thermally decomposable compound prior to the alloying step. Five aqueous solutions were prepared containing five percent by weight, respectively of manganese carbonate, manganese sulfate, manganese chloride, copper sulfate and copper hydroxide. Five stainless steel samples were cleaned by an alkaline cleaner, water-rinsed and dried, and each stainless steel sample was then dipped for 3 minutes in one of the aqueous solutions maintained at 140°F. All samples were heated for 10 minutes at 1800°F which included early decomposition of the compound where possible and alloying. This produced a brown to black roughened surface on each sample. An aqueous slip as described in Examples 1 through 8 was next conventionally applied to the samples which were then fired for 10 minutes at 1800°F.

The sample treated with manganese chloride spalled very badly, while the sample treated with manganese sulfate had some edge spalling but was generally acceptable. However, the samples treated with manganese carbonate and with copper hydroxide had no spalling at all and excellent adherence of the ceramic coat. The sample treated with copper sulfate had good impact adherence but some slight edge spalling.

The difference noted among the manganese and copper samples can be explained by the melting or decomposing characteristics of the compounds used. Manganese chloride melts at 1202°F (650°C) and boils at 2174°F (1190°C), well above the alloying temperature. As a result, this compound did not decompose but remained on the surface of the sample as the originally applied compound during the alloying, produced little or no adherence of the ceramic coat, and created spalling. Manganese sulfate melts at 1290°F (700°C) and decomposes at 1562°F (850°C). Accordingly, there was decomposition of the manganese sulfate and some alloying of the decomposed compound with the stainless steel substrate, but the adherence of the ceramic coat was not exceptionally strong because the decomposition took place below but near the alloying temperature. It is preferred that the compound decompose at least 300°F below the alloying temperature.

Manganese carbonate and copper hydroxide, however, decompose readily upon heating. Therefore, the results in these cases were excellent. In like manner, copper sulfate decomposes at 1202°F (650°C) and therefore the desired decomposition took place, but results while acceptable were not as excellent as in the case of copper hydroxide due to the higher decomposition temperature.

Ferric sulfate decomposes about 896°F (480°C) and therefore can also be used in the present process.

There are some decomposable compounds that do produce good results in accordance with the present invention, even though their decomposition temperatures are relatively high. For example, nickel sulfate decomposes at 1588°F (848°C) and yet produces good results.

EXAMPLES 37 through 40

These examples refer to the accompanying figures and illustrate the nature of the interface between stainless steel and a ceramic coat. The photomicrographs reproduced in the figures are all at a 30° angled cross-section and at 250×. The specimens of FIGS. 1 through 4 comprise stainless steel 304, represented at 10, and were all annealed at 1800°F for 10 minutes. The ceramic frit of Examples 1 through 8 was used in each case and fired at about 1600°F for 10 minutes to form a ceramic coat indicated at 11.

In FIG. 1, there was no pre-treatment of the stainless steel as contemplated by the present invention prior to application of the ceramic coat 11. This coat had a very poor adhesion and spalled at the edges In FIG. 2, a two percent by weight aqueous solution of ammonium molybdate was applied to the stainless steel prior to annealing. The ceramic coat 11 applied later had excellent adherence. It will be noted that interfacial areas 12 have formed comprising an alloy of stainless steel components and molybdenum.

Figure 3:
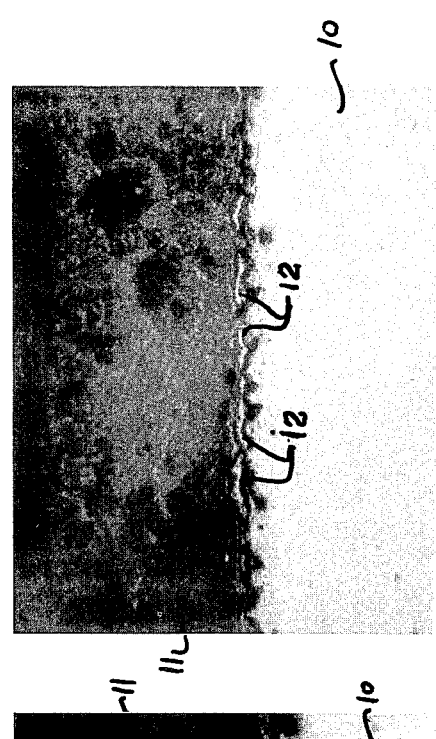
FIGS. 3 and 4 are photomicrographs, each at 250X, of stainless steel having a ceramic coat in which, prior to deposition of the coat, the stainless steel was treated with, respectively, a four percent and a six percent by weight aqueous solution of ammonium molybdate in accordance with the present invention.

In FIG. 3, a four percent by weight aqueous solution of ammonium molybdate was applied to the stainless steel prior to annealing. The ceramic coat 11 had excellent adherence. The interfacial alloy 12 of stainless steel components and molybdenum has increased in predominance.

Figure 4:
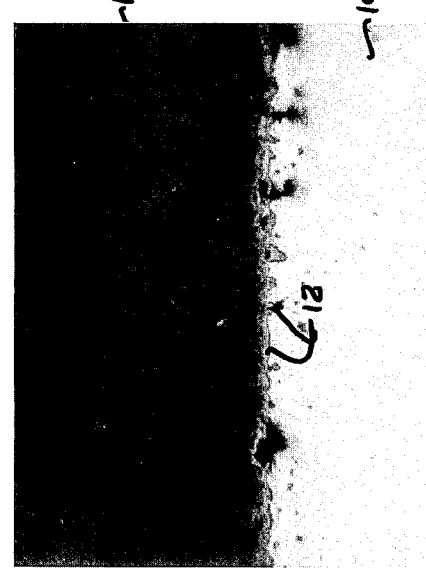

In FIG. 4, a six percent by weight aqueous solution of ammonium molybdate was applied to the stainless steel prior to annealing. The after-applied ceramic coat 11 had excellent adherence. It will be noted that interfacial areas 12 comprising an alloy of stainless steel components and molybdenum have spread further along the interface forming more of an interfacial layer. In some of the photomicrographs, the alloy has penetrated into the stainless steel, thereby affording even a stronger bond.

In addition to the ceramic frit compositions disclosed, other ceramic frits may be employed. For example, the so-called cosmetic ceramic coatings can be used. These coatings impart an esthetically pleasing color or appearance.

Although the foregoing discloses several embodiments of the present invention, it is understood that the invention may be practiced in still other forms within the scope of the following claims.

I claim:

1. In the process of depositing a frit composition on a substrate and then heating to form a ceramic coat from the frit composition, the improvement prior to depositing said frit composition comprising using as the substrate a metallic workpiece that is not sufficiently electrochemically active to be coated by electrophoresis and that contains at least 10% by weight of a metal selected from nickel, chromium, and mixtures thereof, covering at least a portion of said substrate with a film of an oxide or a thermally decomposable compound of a transition metal selected from Group IIIB through Group IIB of the Periodic Table of The Elements, said compound being thermally decomposable at a temperature below the alloying temperature of the workpiece and transition metal, and then heating the workpiece to an alloying temperature within the range of about 1000°F to about 1800°F to alloy the transitional metal therewith.

2. The process of claim 1 in which said metallic workpiece is stainless steel.

3. The process of claim 1 in which said transitional metal compound is water-soluble, and said covering the metallic workpiece with the transitional metal compound comprises contacting the metallic workpiece with an aqueous solution of the compound.

4. The process of claim 1 in which said transitional metal is molybdenum.

5. The process of claim 1 in which said heating includes heating for about 1 minute to about 30 minutes.

6. The process of claim 1 in which the substrate of said metallic workpiece is cleaned prior to covering said substrate with a film of the transitional metal oxide or compound.

7. The process of claim 1 in which heating said workpiece decomposes the compound of said transition metal and converts it to an oxide of said metal.

8. The process of claim 1 in which said substrate is covered by a compound of the transition metal that is water-soluble by contacting said substrate for 15 seconds to 30 minutes with an aqueous solution of the transition metal compound maintained at about 125°F to about 200°F and containing from about 0.5% to about 10% by weight of said compound.

9. The process of claim 1 in which said compound of the transition metal decomposes below about 600°F during said heating step.

10. The process of claim 1 in which said transition metal is selected from the group consisting of molybdenum, chromium, cobalt, copper, manganese, vanadium, iron, nickel, zinc and tungsten.

11. A process for preparing a metallic workpiece having a substrate that is not sufficiently electrochemically active to be coated by electrophoresis and that contains at least 10% by weight of a metal selected from nickel, chromium, and mixtures thereof for deposition thereon of a ceramic coat, comprising contacting said substrate with an aqueous solution of a thermally decomposable, water soluble compound of a transition metal selected from Group IIIB through Group IIB of the Periodic Table of The Elements to deposit thereon a film of the compound, heating the workpiece to thermally decompose said compound below an alloying temperature of the workpiece, and then heating the workpiece to an alloying temperature within the range of about 1000°F to about 1800°F to alloy the transition metal of said compound with the substrate.

12. The process of claim 11 including depositing a ceramic coat onto the alloyed substrate of the workpiece.

13. The process of claim 11 in which said substrate is contacted for 1 to 15 minutes with an aqueous solution of the water-soluble compound maintained at a temperature of about 125°F to about 180°F and containing from about 0.5% to about 10% by weight of the compound.

14. The process of claim 11 in which said compound thermally decomposes below about 600°F.

15. The process of claim 11 in which said transition metal is molybdenum.

16. The process of claim 11 in which said substrate is stainless steel.

17. A process for preparing a workpiece having a metallic substrate that is not sufficiently electrochemically active to be coated by electrophoresis for a subsequent deposition of a ceramic coating, said substrate containing at least 10% by weight of a metal selected from nickel, chromium, and mixtures thereof, comprising covering at least a portion of said substrate with a film of an oxide or a compound of a transition metal selected from Groups IIIB through Group IIB of the Periodic Table of The Elements, said transitional metal compound being thermally decomposable at a temperature below an alloying temperature of the workpiece and transition metal, heating the workpiece below such alloying temperature to thermally decompose said compound, depositing ceramic particles onto the treated substrate of the workpiece, and then firing the workpiece to provide a ceramic coat from said particles on the workpiece, at least one of said heating and firing steps also including heating to an alloying temperature within the range of about 1000°F to about 1800°F to alloy said transition metal with said substrate of the workpiece.

* * * * *